United States Patent
Tahira et al.

(10) Patent No.: US 7,456,446 B2
(45) Date of Patent: Nov. 25, 2008

(54) SEMICONDUCTOR DEVICE

(75) Inventors: Koichi Tahira, Nagasaki (JP); Hiroki Usui, Kanagawa (JP); Hiroshi Hasegawa, Kanagawa (JP); Makoto Aikawa, Kanagawa (JP)

(73) Assignee: Sony Corporation (JP)

( * ) Notice: Subject to any disclaimer, the term of this patent is extended or adjusted under 35 U.S.C. 154(b) by 700 days.

(21) Appl. No.: 10/997,905

(22) Filed: Nov. 29, 2004

(65) Prior Publication Data

US 2005/0116268 A1 Jun. 2, 2005

(30) Foreign Application Priority Data

Dec. 4, 2003 (JP) ............................ P2003-405343

(51) Int. Cl.
*H01L 27/10* (2006.01)
(52) U.S. Cl. ..................... 257/204; 257/206; 257/202
(58) Field of Classification Search ......... 257/206–208, 257/690–692, 532, 730, 288, 401, 737, 738

See application file for complete search history.

(56) References Cited

U.S. PATENT DOCUMENTS

| 6,020,616 A * | 2/2000 | Bothra et al. ............... 257/381 |
| 6,516,457 B1 * | 2/2003 | Kondou ......................... 716/8 |
| 6,707,107 B2 * | 3/2004 | Kido .......................... 257/354 |
| 2001/0004122 A1 * | 6/2001 | Ito ............................ 257/368 |
| 2003/0132464 A1 * | 7/2003 | Yamaguchi et al. ......... 257/288 |
| 2004/0213029 A1 * | 10/2004 | Hirata et al. ................ 365/104 |

\* cited by examiner

*Primary Examiner*—Mary Wilczewski
*Assistant Examiner*—Monica Lewis
(74) *Attorney, Agent, or Firm*—Rader, Fishman & Grauer PLLC; Ronald P. Kananen

(57) ABSTRACT

A semiconductor device of the generation with the minimum processing dimensions of 90 nm, or later, wherein variation of processing dimensions of gate electrodes in a logic block and a power source noise are suppressed; wherein a gate electrode formed to have a comb-shaped pattern is formed on a normal cell region, a dummy gate electrode formed to have a comb-shaped pattern is formed on a vacant region, a wiring for applying a predetermined voltage is connected respectively to at least a part of the dummy gate and the semiconductor substrate (source drain regions), and an electrostatic capacity between the part of the dummy gate electrode and the semiconductor substrate constitutes a decoupling capacitor of the power source.

2 Claims, 5 Drawing Sheets

DG DUMMY GATE ELECTRODE
SD$_P$, SD$_N$ SOURCE DRAIN REGION
PTr P-CHANNEL MOS TRANSISTOR
NTr N-CHANNEL MOS TRANSISTOR

DG DUMMY GATE ELECTRODE
$SD_P, SD_N$ SOURCE DRAIN REGION
PTr P-CHANNEL MOS TRANSISTOR
NTr N-CHANNEL MOS TRANSISTOR

SEMICONDUCTOR DEVICE

BACKGROUND OF THE INVENTION

1. Field of the Invention

The present invention relates to a semiconductor device, particularly relates to a semiconductor device comprising a logic block.

2. Description of the Related Art

Demands for more compact, thinner and lighter portable electronic devices, such as a digital video camera, a digital cellular phone and a notebook computer, only get stronger. To respond thereto, seven tenths of reduction has been realized in three years in a recent VLSI and other semiconductor devices.

Such a reduction of semiconductor devices has been attained by an improvement of production techniques, such as a lithography technique and etching technique, and development of processing techniques to attain the minimum processing dimension of 90 nm has been pursued.

In production techniques before the generation of 90 nm, variation of processing dimensions of gate electrodes of MOS transistors was ±5 to 10% or so with respect to a targeted dimension including a lithography technique and etching technique.

However, in currently pursued production techniques of the 90 nm generation, variation of the processing dimensions is ±10 to 15% or so, and the variation of the processing dimensions is liable to become larger with the pursuance of miniaturization in the 90 nm generation or later. As explained above, in a semiconductor device, when variation of processing dimensions of gate electrodes becomes large, unevenness of DC components of a power consumption becomes large, so that it becomes difficult to attain a higher speed and a lower power consumption at a time.

Particularly, in a semiconductor device including a logic block, normally, a region for forming a gate electrode and a vacant region for not forming a gate electrode of a MOS transistor composing a logic circuit exist in a logic block, and a pattern density in the logic block is uneven.

Therefore, due to a light proximity effect at exposure and a micro-loading effect at etching in a step for performing pattern processing on a gate electrode, it is liable that a difference arises between processing dimensions of the gate electrode in a nondense region and processing dimensions in a dense region, which leads to wider variation of processing dimensions.

Accordingly, when designing a semiconductor device including a logic block of the 90 nm generation or later, it is particularly necessary that variation of processing dimensions of a gate electrode is suppressed.

A technique of forming a dummy electrode spreading allover a vacant region in the logic block to suppress variation of processing dimensions has been known, however, suppression of the variation of processing dimensions thereby was insufficient.

On the other hand, it is known that, along with miniaturization, and a larger scale and a higher frequency of a circuit in a semiconductor device of the 90 nm generation or later, a power source noise on a chip increases exponentially.

Since the increase of a power source noise causes an erroneous operation of the circuit, a remedy has been particularly demanded to suppress the power source noise in a semiconductor device of the 90 nm generation or later.

SUMMARY OF THE INVENTION

An object of the present invention is to solve the disadvantage that variation of processing dimensions of gate electrodes increases in a logic block and a power source noise increases in a semiconductor device of the 90 nm generation or later.

According to the present invention, there is provided a semiconductor device formed with a logic block having a normal cell region and a vacant region, comprising a semiconductor substrate; a gate electrode having a comb-shaped pattern of formed in the normal cell region of the semiconductor substrate; a dummy gate electrode having a comb-shaped pattern formed in the vacant region of the semiconductor substrate; a wiring connected with at least a part of the dummy gate electrode and the semiconductor substrate, so that a decoupling capacitor of a power source of the semiconductor device is constituted by an electrostatic capacity between at least the part of the dummy gate electrode and the semiconductor substrate.

In the above semiconductor device of the present invention, the gate electrode formed to have a comb-shaped pattern is formed on a normal cell region and the dummy gate electrode formed to have a comb-shaped pattern is formed on a vacant region of the semiconductor substrate.

Here, at least a part of the dummy gate electrode and the semiconductor substrate are connected to wiring, and an electrostatic capacity between the part of the dummy gate electrode and the semiconductor substrate constitutes a decoupling capacitor of a power source.

In the semiconductor device of the present invention, variation of processing dimensions of gate electrodes in a logic block is suppressed and a power source noise is suppressed particularly in a semiconductor device of the generation, where in the minimum processing dimension is 90 nm, or later.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, embodiments of a semiconductor device according to the present invention will be explained with reference to the attached drawings.

First Embodiment

Figure 1:
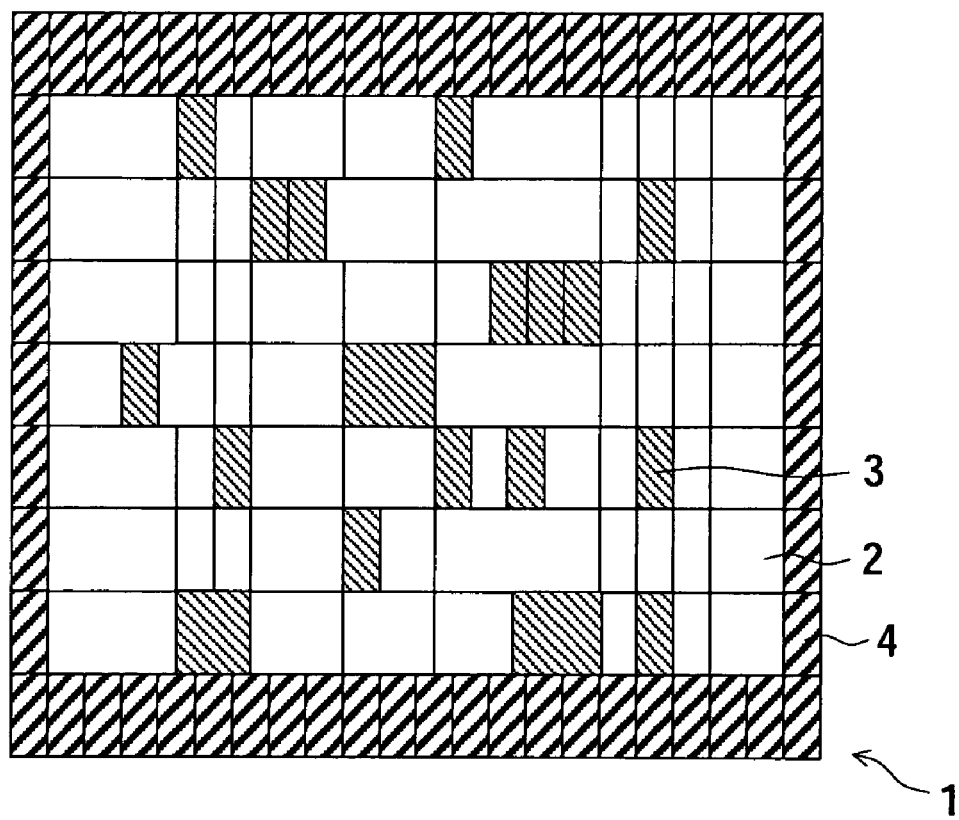
FIG. 1 is a plan view of a layout of a logic block of a semiconductor device produced in a processing process, wherein the minimum processing dimension is 90 nm, according to an embodiment of the present invention.

FIG. 1 is a plan view of a layout of a logic block of a semiconductor device produced by a production process, wherein the minimum processing dimension is 90 nm, according to the present embodiment.

A semiconductor device 1 according to the present embodiment is provided with a logic block having normal cell regions 2 and vacant regions 3, and is further provided with peripheral circuit regions 4 surrounding it.

In the above normal cell region, for example, a CMOS (complementary MOS) transistor composed of a P-channel MOS (metal—oxide film—semiconductor) transistor and an N-channel MOS transistor provided with a gate electrode having a comb-shaped pattern, is formed via a gate insulation film on a semiconductor substrate, and the CMOS transistor constitutes a logic circuit.

On the other hand, a dummy cell provided with a dummy gate electrode having the same comb pattern as on the normal cell is formed also on the vacant cell. Details thereof will be explained below.

Figure 2:
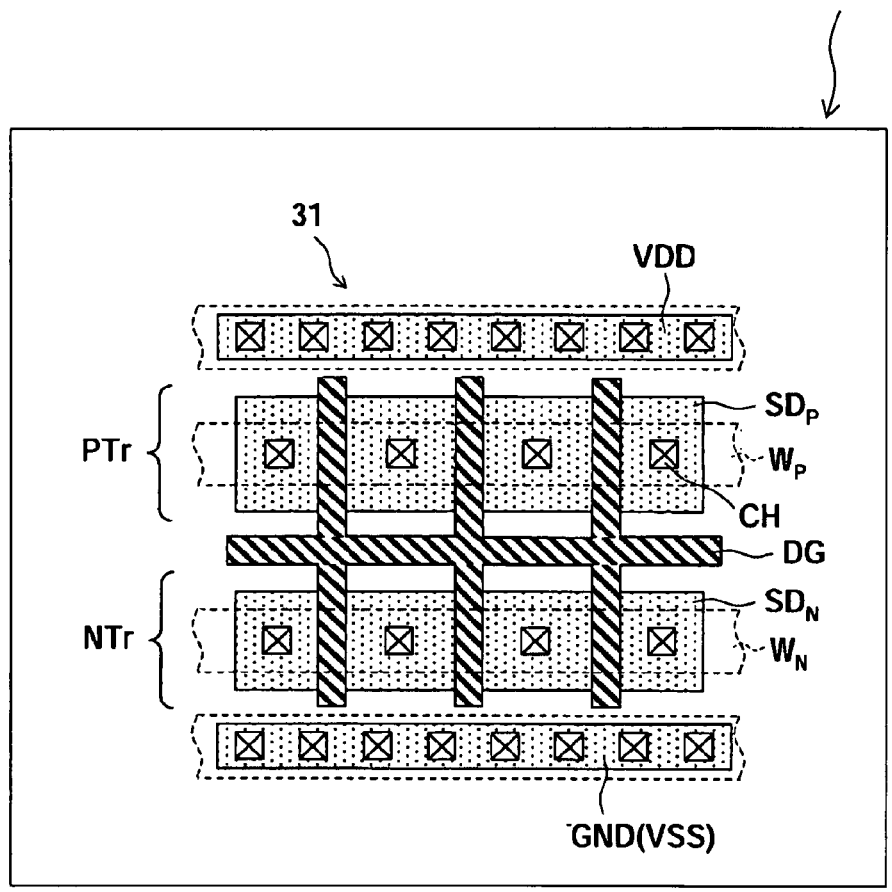
FIG. 2 is a plan view of a layout of a dummy cell on a vacant region of the logic block of the semiconductor device according to an embodiment of the present invention.

FIG. 2 is a plan view showing a layout of a dummy cell 31 in a vacant region 3 of the logic block of the semiconductor device according to the present embodiment.

On the vacant region of the logic block, the same P-channel MOS transistor (PTr) region and N-channel MOS transistor (NTr) region as those on the normal cell are provided and, for example, a dummy gate having the same comb shape as the normal cell is formed allover these regions.

A dummy gate electrode DG of the dummy cell and a gate electrode of the normal cell region are formed to have a length in the channel direction (a width of the comb-shaped pattern) of, for example, 90 nm, which is the minimum processing dimension.

Furthermore, on the surface of a semiconductor substrate at both side portions of the dummy gate electrode DG, a P-type source drain region $SD_P$, wherein a P-type impurity is introduced, is formed on the PTr region, and an N-type source drain region $SD_N$ wherein an N-type impurity is introduced is formed on the NTr region.

As explained above, in the same way as in the normal cell region, a CMOS transistor composed of a P-channel transistor and an N-channel MOS transistor is formed also on the dummy cell.

Note that these CMOS transistors are not used as a logic circuit, and at least a part of the dummy gate electrode and the semiconductor substrate (a source drain region of the CMOS transistors) are connected to wiring, so that a decoupling capacitor of a power source is constituted by an electrostatic capacity between at least the part of the dummy gate electrode and the semiconductor substrate.

A dummy transistor formed on the dummy cell conforms with a CMOS transistor used in a normal cell. For example, height of the normal cell composed of a CMOS transistor and a height of the dummy cell composed of a CMOS transistor in the same way can be conformed, and a use efficiency of a wasteful space arising in the vacant region can be improved.

To compose the above dummy cell, for example, the P-type source drain region $SD_P$ on the PTr region is connected to an upper layer wiring $W_P$ via a contact hole CH and, furthermore, connected to a power source voltage wiring VDD provided near the PTr region on a not shown region.

On the other hand, the N-type source drain region $SD_N$ on the NTr region is connected to the upper layer wiring $W_N$ via a contact hole CH and, furthermore, connected to a ground wiring GND (or a negative power source voltage wiring VSS) provided near the NTr region on a not shown region.

Also, the dummy gate electrode DG is connected to the power source voltage wiring VDD and wiring, such as ground wiring GND, on a not shown region, so that a predetermined voltage is applied and an electrostatic capacity is formed between itself and the semiconductor substrate. The power source voltage wiring VDD and the ground wiring GND are also connected to other wiring via the contact hole CH.

In the semiconductor device according to the present embodiment explained above, a gate electrode is formed on a normal cell region of the logic block and, furthermore, a dummy gate electrode having the same pattern as that on the normal cell region is formed on the vacant region, so that the pattern density within the logic block becomes unified, and it becomes possible to uniformly activate a light proximity effect at exposure and a micro-loading effect at etching in a step for performing pattern processing on a gate electrode. Accordingly, particularly even in a semiconductor device comprising a logic block of the 90 nm generation or later, variation of processing dimensions of gate electrodes can be suppressed.

Also, in the semiconductor device according to the present embodiment explained above, a decoupling capacitor of a power source is constituted by an electrostatic capacity between the dummy gate electrode formed on a vacant region of the logic block and the semiconductor substrate, and a power source noise on the chip, which exponentially increases particularly as a semiconductor device of the 90 nm generation or later gets finer and the circuit becomes large-scaled and higher in frequency, is suppressed. A considerable space is necessary to provide a decoupling capacitor separately, but it is possible to realize a decoupling capacitor by utilizing a vacant region in the logic block, so that the space can be saved.

In order to suppress variation of processing dimensions of gate electrodes in the logic block as explained above or to simplify the production process, it is preferable that the normal cell region and a vacant cell region are formed to have the same configuration as much as possible. Accordingly, the dummy gate electrode DG is preferably formed to have the same pattern as the pattern of gate electrodes on the normal cell region.

Note that the pattern of the dummy gate electrode is not limited to the above and may be a different pattern from that of the gate electrodes on the normal cell region for other objects.

For example, as explained above, in the case where the gate electrode and the dummy gate electrode respectively include a P-channel transistor gate electrode and an N-channel transistor gate electrode, it can be configured that only the P-channel transistor gate electrode among the dummy gate electrodes is connected to wiring to compose a decoupling capacitor.

When configured in the same way as a normal CMOS transistor, wherein a dummy gate electrode is formed integrally for an N-channel transistor and a P-channel transistor, the both electrodes come to have a common potential, so that an electrostatic capacity between the dummy gate and the semiconductor substrate can be secured in either one of the P-channel transistor and the N-channel transistor and it can be used as a decoupling capacitor.

Normally, the P-channel transistor is provided to have a wider area, so that a larger electrostatic capacity can be secured. Thus, in the above case, an electrostatic capacity between the dummy gate and the semiconductor substrate is preferably used as a decoupling capacitor in the P-channel transistor.

On the other hand, in the same way as the above, in the case where the gate electrode and the dummy gate electrode respectively include a P-channel transistor gate electrode and an N-channel transistor gate electrode, it can be configured that the P-channel transistor gate electrode and the N-channel transistor gate electrode are formed to be separated as dummy electrodes.

Different potentials can be applied to the both electrodes in the above case. Therefore, both of the P-channel transistor and the N-channel transistor can secure an electrostatic capacity between the dummy gate and the semiconductor substrate, and it can be used as a decoupling capacitor.

Note that since a separation region for separating the P-channel transistor gate electrode and the N-channel transistor gate electrode becomes necessary, a region for the P-channel transistor and a region for the N-channel transistor become small and an area contributing to the electrostatic capacity becomes small by that amount in some cases.

In the semiconductor device according to the present embodiment explained above, preferably, as the dummy gate electrode DG, a dummy gate electrode selected for each vacant region among patterns of a dummy gate electrode of a plurality of sizes prepared in advance is formed to match with a size of the vacant region.

In the logic block, vacant regions of a variety of sizes or areas normally exist, so that when forming one kind of dummy cells on the vacant regions, the size does not match and a portion not formed with a dummy cell is liable to be generated.

By preparing in advance dummy gate electrodes of a plurality of sizes, that is, dummy cells of a plurality of sizes, a dummy gate electrode (dummy cell) matching with a size of a vacant region can be formed for each vacant region.

To deal with dummy cells of a plurality of sizes as above, for example, it is preferable to form dummy gate electrodes (dummy cells) in unit of grids.

Figure 3A:
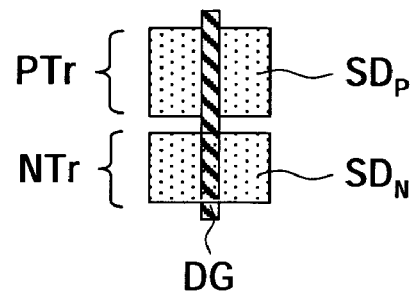
FIG. 3A to FIG. 3C are plan views of dummy cells, wherein a P-channel transistor and an N-channel transistor are provided by the number of one, three and seven, respectively.

FIG. 3A is a plan view of a dummy cell having one of each of the P-channel transistor (PTr) and N-channel transistor (NTr).

Figure 3B:
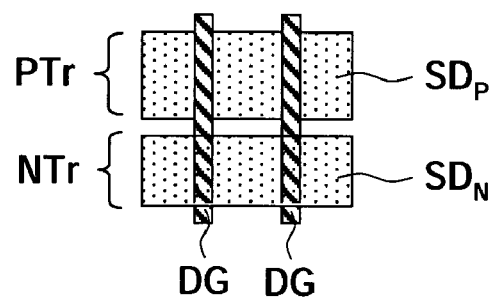
Figure 3C:
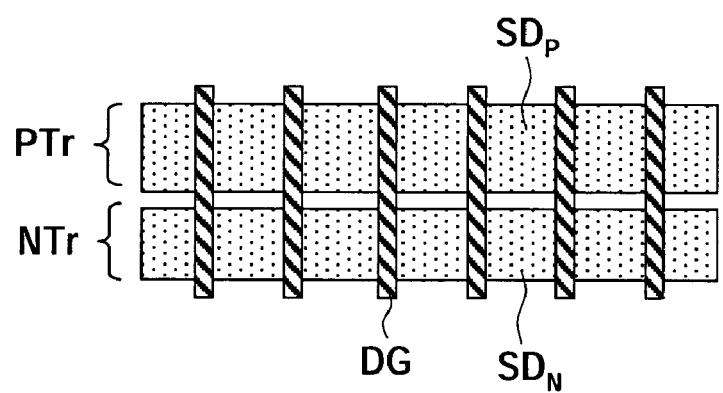

Also, FIG. 3B is a plan view of a dummy cell provided with three of each of the P-channel transistor and the N-channel transistor connected in series, and FIG. 3C is a plan view of a dummy cell provided with seven of each of the P-channel transistor and the N-channel transistor connected in series.

Each dummy cell is composed of a common dummy gate electrode DG for the P-channel transistor and N-channel transistor, a source drain region $SD_P$ of the P-channel transistor and a source drain region $SD_N$ of the N-channel transistor. The dummy gate electrodes DG do not have a pattern of being connected in the serial direction of the transistors, for they are not necessarily connected.

In the semiconductor device of the present embodiment as above, the dummy gate electrode may include a dummy gate electrode not composing a decoupling capacitor.

It is not necessary that all of the dummy gate electrodes configure a decoupling capacitor of a power source from an electrostatic capacity between itself and the semiconductor substrate. There are some cases where a gate leak current increases when composing a decoupling capacitor, so that dummy gate electrodes are not used for a decoupling capacitor more than necessary in the case where the gate leak current has to be suppressed. In terms of the present invention, it is sufficient when at least a part of the dummy gate electrodes composes the decoupling capacitor.

As explained above, on a dummy cell region not composing the decoupling capacitor, it is sufficient only not to open a contact hole for the dummy electrode and source drain region as explained above. In this case, the dummy cell simply functions as a dummy cell only for suppressing variations of processing dimensions of gate electrodes.

EXAMPLE 1

Figure 4A:
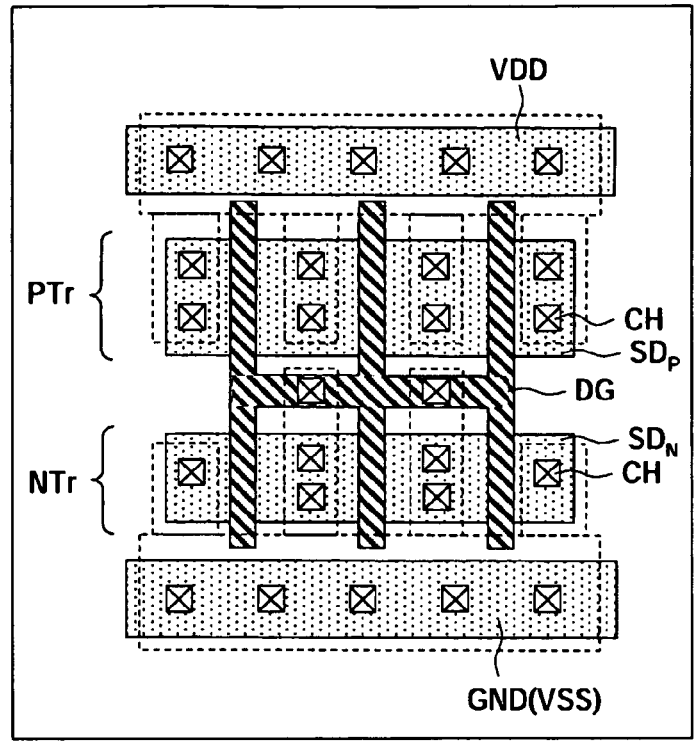
FIG. 4A is a plan view of a layout of a dummy cell of a logic block of a semiconductor device according to an example 1.

FIG. 4A is a plan view of a layout of a dummy cell of a logic block of the semiconductor device according to the present example.

A dummy gate electrode DG is integrally formed on the P-channel transistor (PTr) and the N-channel transistor (NTr) on the semiconductor substrate via a gate insulation film, and a source drain region $SD_P$ of the P-channel transistor PTr and the source drain region $SD_N$ of the N-channel transistor NTr are formed in the semiconductor substrate at the both side portions thereof.

Also, the P-type source drain region $SD_P$ on the PTr region is connected to the power source voltage wiring VDD provided near the PTr region via contact holes CH.

On the other hand, the N-type source drain region $SD_N$ on the NTr region and the dummy gate electrode DG are connected to the ground wiring GND (or a negative power source voltage wiring VSS) provided near the NTr region via contact holes CH.

Figure 4B:
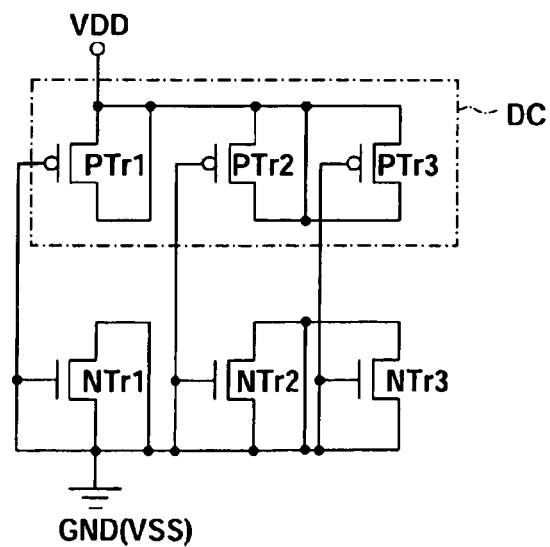
FIG. 4B is an equivalent circuit diagram of the dummy cell shown in FIG. 4A.

FIG. 4B is an equivalent circuit diagram of the dummy cell shown in FIG. 4A.

Three P-channel transistors (PTr1 to PTr3) and three N-channel transistors (NTr1 to NTr3) are formed. Source drain regions of the P-channel transistors (PTr1 to PTr3) are connected to a power source voltage wiring VDD, while source drain regions of the N-channel transistors (NTr1 to NTr3) and gate electrodes (dummy gate electrodes) of the N-channel transistors (NTr1 to NTr3) and P-channel transistors (PTr1 to PTr3) are connected to the ground wiring GND (or a negative power source voltage wiring VSS).

In the above configuration, an electrostatic capacity arises between the dummy gate electrodes and semiconductor substrate in the P-channel transistors (PTr1 to PTr3) and it is used as a decoupling capacitor DC. In the N-channel transistors (NTr1 to NTr3), the dummy gate electrode and the semiconductor substrate have the same potential and an electrostatic capacity does not arise.

Since the dummy gate electrode is formed integrally for the NTr region and the PTr region, it is configured that an electrostatic capacity between the dummy gate and the semiconductor substrate is secured at either one of the PTr region and NTr region and used as a decoupling capacitor. Normally, the PTr has a larger area than the NTr and is capable of securing a larger electrostatic capacity.

EXAMPLE 2

Figure 5A:
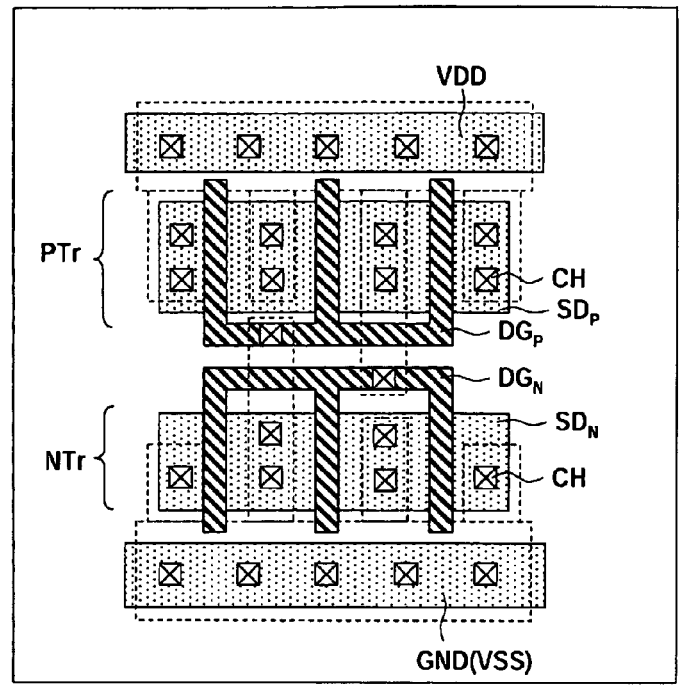
FIG. 5A is a plan view of a layout of a dummy cell of a logic block of a semiconductor device according to an example 2.

FIG. 5A is a plan view of a layout of dummy cells of a logic block of the semiconductor device according to the present example.

On the P-channel transistor (PTr), a dummy gate electrode $DG_P$ is formed on the semiconductor substrate via a gate insulation film, and a source drain region $SD_P$ of the PTr is formed in the semiconductor substrate on both side portions thereof.

On the other hand, on the N-channel transistor (NTr), a dummy gate electrode $DG_N$ is formed on the semiconductor substrate via a gate insulation film, and a source drain region $SD_N$ of the NTr is formed in the semiconductor substrate at the both side portions thereof.

Also, the P-type source drain region $SD_P$ on the PTr region and the dummy date electrode $DG_N$ of the NTr region are connected to the power source voltage wiring VDD provided near the PTr region via contact holes CH.

On the other hand, the N-type source drain region $SD_N$ on the NTr region and the dummy gate electrode $DG_P$ of the PTr region are connected to the ground wiring GND (or a negative power source voltage wiring VSS) provided near the NTr region via contact holes CH.

Figure 5B:
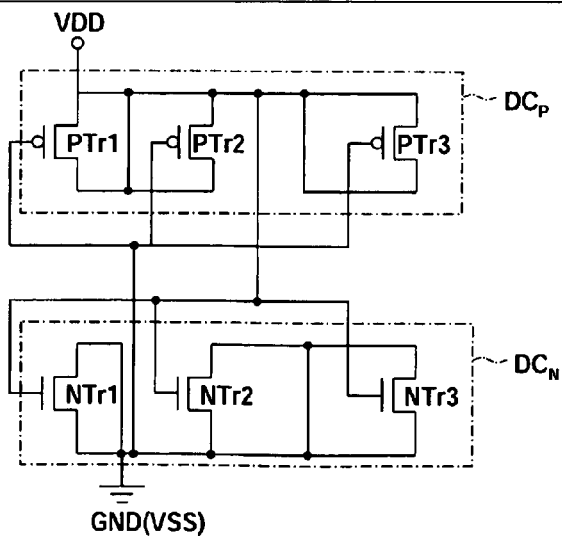
FIG. 5B is an equivalent circuit diagram shown in FIG. 5A.

FIG. 5B is an equivalent circuit diagram of the dummy cell shown in FIG. 5A.

Three P-channel transistors (PTr1 to PTr3) and three N-channel transistors (NTr1 to NTr3) are formed. Source drain regions of the P-channel transistors (PTr1 to PTr3) and gate electrodes (dummy gate electrodes) of the N-channel transistors (NTr1 to NTr3) are connected to a power source voltage wiring VDD, while source drain regions of the N-channel transistors (NTr1 to NTr3) and gate electrodes (dummy gate electrodes) of the P-channel transistors (PTr1 to PTr3) are connected to the ground wiring GND (or a negative power source voltage wiring VSS).

In the above configuration, an electrostatic capacity arises between the dummy gate electrodes and the semiconductor substrate in the P-channel transistors (PTr1 to PTr3) and is used as a decoupling capacitor $DC_P$. In the N-channel transistors (NTr1 to NTr3), it is configured that an electrostatic capacity arises between the dummy gate electrode and the semiconductor substrate and is used as a decoupling capacitor $DC_N$.

Since the P-channel transistor gate electrode and the N-channel transistor gate electrode are formed to be separated, an electrostatic capacity can be secured between the dummy gate and the semiconductor substrate in both of the P-channel transistors and the N-channel transistors, and it can be used as a decoupling capacitor.

The present invention is not limited to the above explanation.

For example, a dummy cell provided with a dummy gate may be applied to a vacant region generated on a peripheral circuit region of the logic block other than a vacant region in the logic block.

Other than the above, a variety of modifications may be made within the scope of the present invention.

The semiconductor device of the present invention can be applied to a semiconductor device including a logic block of the generation, wherein the minimum processing dimension is 90 nm, or later.

What is claimed is:

1. A semiconductor device formed with a logic block having a normal cell region and a vacant region, comprising:
    a semiconductor substrate;
    a gate electrode having a comb-shaped pattern formed in the normal cell region of the semiconductor substrate;
    a dummy gate electrode having a comb-shaped pattern formed in the vacant region of the semiconductor substrate;
    a wiring connected with at least a part of the dummy gate electrode and the semiconductor substrate, so that a decoupling capacitor of a power source of the semiconductor device is constituted by an electrostatic capacity between at least the part of the dummy gate electrode and the semiconductor substrate.

2. A semiconductor device as set forth in claim 1, wherein the gate electrode and the dummy gate electrode include a p-channel transistor gate electrode and an n-channel transistor gate electrode, respectively, and
    only the p-channel transistor gate electrode of the dummy gate electrode is connected to the wiring so as to constitute the decoupling capacitor.

* * * * *